(12) United States Patent
Yu

(10) Patent No.: US 12,119,257 B2
(45) Date of Patent: Oct. 15, 2024

(54) FLOATING PIN, WAFER CARRYING DEVICE AND DEPOSITING APPARATUS

(71) Applicant: CHANGXIN MEMORY TECHNOLOGIES, INC., Hefei (CN)

(72) Inventor: Chaoqun Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 411 days.

(21) Appl. No.: 17/455,734

(22) Filed: Nov. 19, 2021

(65) Prior Publication Data

US 2022/0216093 A1 Jul. 7, 2022

Related U.S. Application Data

(63) Continuation of application No. PCT/CN2021/098878, filed on Jun. 8, 2021.

(30) Foreign Application Priority Data

Jan. 6, 2021 (CN) .......................... 202110012335.5

(51) Int. Cl.
*H01L 21/687* (2006.01)
*C23C 16/458* (2006.01)

(52) U.S. Cl.
CPC .... *H01L 21/68742* (2013.01); *C23C 16/4584* (2013.01); *H01L 21/68771* (2013.01)

(58) Field of Classification Search
CPC ......... H01L 21/68707; H01L 21/68728; H01L 21/68742; H01L 21/6875
See application file for complete search history.

(56) References Cited

U.S. PATENT DOCUMENTS 5,695,568 A * 12/1997 Sinha ................ H01L 21/68721
                                                            118/728
5,711,647 A * 1/1998 Slocum .................... B23Q 7/04
                                                            414/941

(Continued)

FOREIGN PATENT DOCUMENTS

| CN | 204760365 U | 11/2015 |
| CN | 106449500 A | 2/2017 |

(Continued)

OTHER PUBLICATIONS

International Search Report as cited in PCT/CN2021/098878 mailed Oct. 9, 2021, 11 pages.

*Primary Examiner* — Tyrone V Hall, Jr.
(74) *Attorney, Agent, or Firm* — Syncoda LLC; Feng Ma

(57) ABSTRACT

The present application provides a floating pin, a wafer carrying device and a depositing apparatus, which relates to the technical field of semiconductor apparatus, and is used for solving the technical problem of low yield of a workpiece to be processed. The floating pin includes a pin body and a pin head connected to one end of the pin body, wherein the pin head protrudes in relation to a side surface of the pin body, and a side surface of a protruding part of the pin head is a curved surface. By reducing the distance between the pin head and the workpiece to be processed, the impact force on the workpiece to be processed when the pin head collides with the workpiece to be processed can be reduced, damages to the workpiece to be processed can be reduced, and the yield of the workpiece to be processed can be improved.

20 Claims, 5 Drawing Sheets

(56) References Cited

U.S. PATENT DOCUMENTS

| | | | |
|---|---|---|---|
| 10,748,806 | B2 | 8/2020 | Chen et al. |
| 2015/0000599 | A1 | 1/2015 | Chen et al. |
| 2018/0005849 | A1* | 1/2018 | Lee .................... H01L 21/6715 |
| 2020/0124987 | A1 | 4/2020 | Park |

FOREIGN PATENT DOCUMENTS

| | | |
|---|---|---|
| CN | 107564836 A | 1/2018 |
| CN | 111276428 A | 6/2020 |
| CN | 111463165 A | 7/2020 |
| CN | 112820689 A | 5/2021 |
| JP | H07115081 A | 5/1995 |
| JP | 2002280342 A | 9/2002 |
| JP | 2002313874 A | 10/2002 |
| KR | 20040035232 A | 4/2004 |
| KR | 20050113710 A | 12/2005 |
| KR | 20070068745 A | 7/2007 |
| KR | 100889633 B1 | 3/2009 |
| KR | 101394092 B1 | 5/2014 |
| KR | 20180076072 A | 7/2018 |
| KR | 20200029070 A | 3/2020 |

\* cited by examiner

FLOATING PIN, WAFER CARRYING DEVICE AND DEPOSITING APPARATUS

CROSS-REFERENCE TO RELATED APPLICATIONS

This application is a continuation application of International Patent Application No. PCT/CN2021/098878, filed on Jun. 8, 2021, which claims priority to Chinese Patent Application No. 202110012335.5, filed with the Chinese Patent Office on Jan. 6, 2021 and entitled "FLOATING PIN, WAFER CARRYING DEVICE AND DEPOSITING APPARATUS." International Patent Application No. PCT/CN2021/098878 and Chinese Patent Application No. 202110012335.5 are incorporated herein by reference in their entireties.

TECHNICAL FIELD

The present application relates to the technical field of semiconductor apparatus, in particular to a floating pin, a wafer carrying device and a depositing apparatus.

BACKGROUND

Generally, semiconductor manufacturing process includes multiple processes. For example, a wafer is usually formed into desired integrated circuit structures by photolithography, deposition, curing, annealing and other processes. In the above processes, the wafer often needs to be placed on a machine table to facilitate the corresponding preparation process on the wafer.

For example, in the process of Chemical Vapor Deposition (CVD), the wafer is exposed to one or more precursors, so that an oxidation-reduction reaction occurs on the wafer surface, so as to deposit a thin film on the wafer surface. In the process of film deposition, the wafer is usually placed on and sucked to a machine table, so that the machine table drives the wafer to rotate therewith, so as to improve the uniformity of the thickness of the formed thin film. Mounting holes are also provided in an area corresponding to the edge of the wafer in the machine table, in which floating pins are placed. The floating pins protrude from the surface of the machine table, which is used for preventing the wafer from being thrown off the machine table as the wafer is rotated with the machine table, thus ensuring that the film deposition process can be carried out smoothly.

However, the floating pins described above are prone to cause damage to the edge of the wafer, thereby leading to the low yield of the wafer.

SUMMARY

In view of this, an embodiment of the present application provides a floating pin, a wafer carrying device and a depositing apparatus, which are used for improving the yield of a workpiece to be processed.

In order to achieve the above object, the embodiments of the present application provide the following technical solutions:

In a first aspect, an embodiment of the present application provides a floating pin, which includes a pin body and a pin head connected to one end of the pin body, in which the pin head protrudes in relation to a side surface of the pin body, and a side surface of a protruding part of the pin head is a curved surface.

In a second aspect, an embodiment of the present application further provides a wafer carrying device, which includes: a machine table with a revolving center, in which the machine table includes a carrying area provided around the revolving center and used for placing wafers, and an edge of the carrying area away from the revolving center is provided with mounting holes; the floating pin as described above installed in the mounting hole, the pin body is inserted into the mounting hole, and at least part of the pin head extends to the carrying area.

In a third aspect, an embodiment of the present application further provides a depositing apparatus, which includes a reaction chamber, within which the wafer carrying device as described above is provided.

In addition to the technical problems solved by the embodiments of the present application described above and the technical features constituting the technical solutions, other technical problems that can be solved by the floating pin, the wafer carrying device and the depositing apparatus provided by the embodiments of the present application, other technical features included in the technical solutions and the beneficial effects brought by these technical features will be further explained in detail in the Detailed Descriptions.

DETAILED DESCRIPTION

Figure 1:
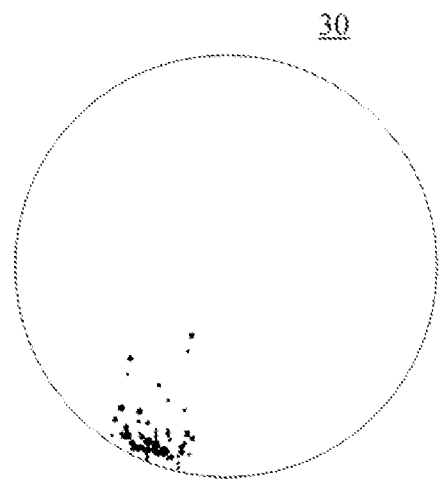
FIG. 1 is a schematic diagram of damages of a wafer in the related art.

In the related art, the floating pin is located in the mounting hole, and there is a large distance between the floating pin and a workpiece to be processed, such as a wafer. When the workpiece to be processed collides with the floating pin in centrifugal motion, there is a large impulse between the workpiece to be processed and the floating pin, and the workpiece to be processed is greatly impacted. On the other hand, the workpiece to be processed and the floating pin are in point contact or line contact when they collide with each other, and the local stress exerted on the workpiece to be processed is also large. As shown in FIG. 1, the edge of the workpiece to be processed is prone to crack or generate powder due to impact, and is also prone to be scratched by the sharp edge of the floating pin, thus affecting the yield of the workpiece to be processed.

The embodiment of the present application provides a floating pin, which includes a pin body and a pin head connected to one end of the pin body. The pin head protrudes in relation to the side surface of the pin body, so as to reduce the distance between the pin head and the workpiece to be processed, thereby reducing the impact on the workpiece to be processed when the pin head collides with the workpiece to be processed. In addition, the side surface of the protruding part of the pin head is a curved surface, which can reduce or avoid scratching the workpiece to be processed by the pin head.

In order to make the object, technical solution and advantages of the embodiments of the present application clearer, the technical solution of the present embodiments will be described below clearly and completely with reference to the drawings of the present embodiments. Obviously, the described embodiments are part, instead of all, of the embodiments of the present application. Based on the embodiments in the present application, all other embodiments obtained by those having ordinary skills in the art without creative labor fall into the scope of the present application.

Figure 2:
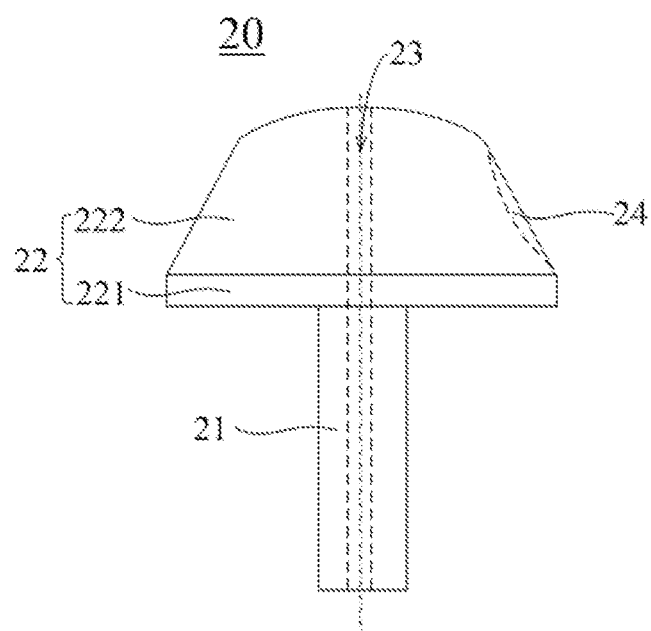
FIG. 2 is a structural schematic diagram of a floating pin according to an embodiment of the present application.

Referring to FIG. 2, a floating pin 20 in the present embodiment includes a pin head 22 and a pin body 21, the pin head 22 is connected to one end of the pin body 21, as shown in FIG. 2, the pin head 22 is connected to an upper end of the pin body 21, and the pin body is inserted into a mounting hole.

The pin head 22 protrudes in relation to the side surface of the pin body 21 to make the pin head 22 close to a workpiece to be processed, such as a wafer, so as to reduce the distance between the pin head 22 and the workpiece to be processed, thereby reducing the impact on the workpiece to be processed when the workpiece to be processed collides with the pin head 22.

For convenience of description, in the embodiments of the present application and the following embodiments, the workpiece to be processed is taken as a wafer as an example, and the workpiece to be processed can also be other elements or parts.

The proximity of the pin head 22 to the wafer 30 can reduce the distance between the pin head 22 and the wafer 30, thereby reducing the impact on the wafer 30 when the wafer 30 collides with the pin head 22. The principle thereof is as follows: when the wafer moves circularly around a central point, its moving path is as shown by the dotted line in FIG. 3. The required centripetal force $F_2$ during the circular motion of the wafer can be calculated by the following formula:

$$F_2 = m\omega^2 r;$$

where m is the mass of the wafer, $\omega$ is the angular velocity, and r is the rotation radius.

Figure 3:
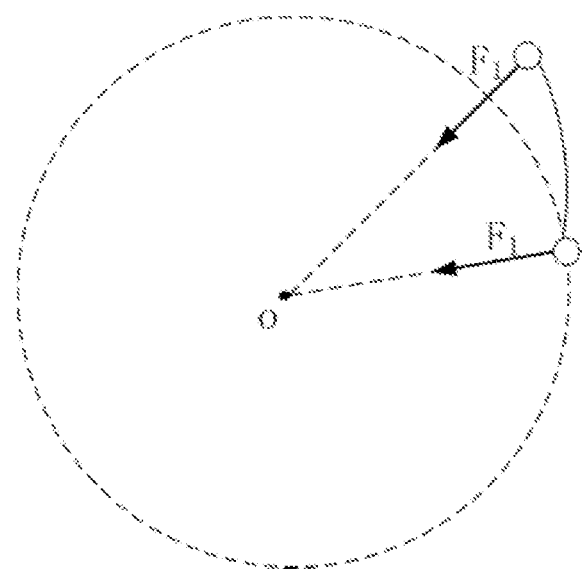
FIG. 3 is a schematic diagram of centrifugal motion of a wafer according to an embodiment of the present application.

When the resultant force $F_1$ exerted on the wafer is equal to the centripetal force $F_2$ required by the wafer, the wafer moves circularly along the dotted line shown in FIG. 3. As the angular velocity increases gradually, the centripetal force required by the wafer 30 for circular motion also increases gradually.

When the resultant force $F_1$ exerted on the wafer 30 is less than the centripetal force $F_2$ required by the wafer, the wafer 30 gradually moves away from the revolving center, as shown in FIG. 3, and the wafer 30 moves outward along the solid line shown in the figure, thus colliding with the pin head 22.

Figure 4:
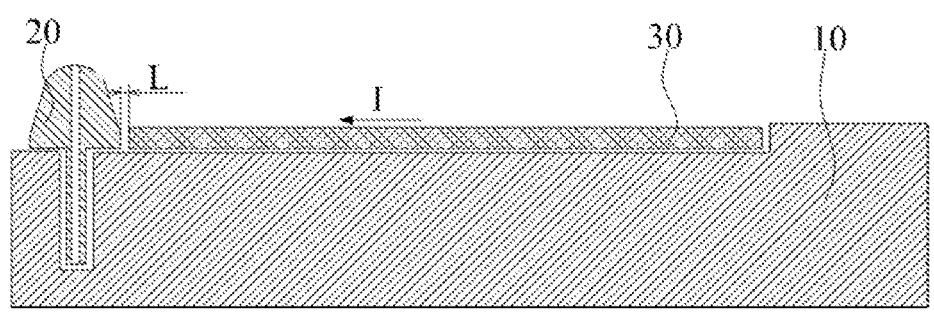
FIG. 4 is a schematic diagram of a wafer colliding with a pin head according to an embodiment of the present application.

Referring to FIG. 4, when the wafer 30 collides with the pin head 22 along the I direction, the impulse P of the wafer 30 can be calculated by the following formula:

$$P = mV;$$

where m is the mass of the wafer 30, and V is the speed at which the wafer 30 collides with the floating pin 20.

As the distance L between the wafer 30 and the pin head 22 increases, the speed increases. It can be seen from the above formula that the impulse on the wafer 30 also increases, that is, the impact on the wafer 30 becomes greater, which leads to the wafer 30 being easily damaged, for example, the edge of the wafer 30 is cracked or particles are generated.

In the present embodiment, the protruding part of the pin head 22 can reduce the distance between the wafer 30 and the pin head 22, thereby reducing the impulse on the wafer 30 when it collides with the pin head 22, reducing the impact on the wafer 30, reducing damages to the wafer 30 and improving the yield of the wafer 30.

With continued reference to FIG. 2, the side surface of the protruding part of the pin head 22 may be a curved surface, for example, the side surface of the pin head 22 facing the wafer 30 is a curved surface, so as to reduce the sharp angle of the side surface of the pin head 22, thereby reducing or avoiding scratching the wafer 30 by the pin head 22.

In some possible examples, a recess for accommodating the edge of the wafer 30 may be formed on the curved surface of the pin head, and the surface of the recess 24 is matched with the side surface of the wafer 30. When the wafer 30 collides with the pin head 22, part of the surface of the pin head 22 is engaged with the side surface of the wafer 30, making the wafer 30 be in surface contact with the pin head 22. According to the present embodiment, when the collision of wafer 30 occurs, the collision area increases, which can reduce the local stress on the wafer 30 and alleviate the problem of stress concentration, compared to the case of point contact. In addition, in the manufacturing process of the wafer 30, the phenomenon of thermal stress concentration of the wafer 30 can be alleviated by adopting surface contact.

With continued reference to FIG. 2, the pin head 22 may include a fixed cross-section portion 221 and a variable cross-section portion 222. One end of the fixed cross-section portion 221 is connected to the pin body 21, and the other end is connected to the variable cross-section portion 222. A fillet transition is made between the side surface of the fixed cross-section portion 221 and the side surface of the variable cross-section portion 222 to reduce or avoid scratching the wafer 30 by the pin head 22. The recess 24 as described above is provided in the side surface of the variable cross-section portion 222.

The end face of the fixed cross-section portion 221 is larger than that of the pin body 21, and the surfaces where the fixed cross-section portion 221 and the variable cross-section portion 222 are connected to each other can coincide. As shown in FIG. 2, the lower end face of the fixed cross-section portion 221 is larger than the upper end face of the pin body 21, and the upper end face of the fixed cross-section portion 221 coincides with the lower end face of the variable cross-section portion 222. The upper end surface of the fixed cross-section portion 221 may be a curved surface.

In some other possible examples, the pin head 22 and the pin body 21 of the floating pin 20 may be an integrated structure. The floating pin 20 may be mushroom-shaped as a whole, and the material of the floating pin 20 may be ceramic.

Since the floating pin 20 is placed in the mounting hole, the pin body 21 of the floating pin 20 is in clearance fit with the mounting hole. When there is an abrupt change in the pressure, the floating pin 20 is displaced in relation to the mounting hole under the action of turbulence. That is to say, when the lifting force on the floating pin 20 is greater than the gravity of the floating pin 20, the floating pin 20 moves upward in relation to the mounting hole, causing the floating pin 20 to detach from the mounting hole, thereby causing an interruption of the manufacturing process of the wafer 30, or even causing the wafer 30 to be scrapped due to dicing.

The lifting force on the floating pin 20 can be calculated according to the following lifting force formula:

$$F_{lift}=(C_y\rho v^2 S)/2$$

where $C_y$ is the lift coefficient, $\rho$ is the air density, $v$ is the relative velocity, and S is the windage contact area. In the present embodiment, the windage contact area S is related to the bottom surface of the pin head 22, specifically, the windage contact area S is related to the contact surface between the pin head 22 and the pin body 21.

With the increase of the bottom surface of the pin head 22, on the one hand, the mass of the pin head 22 increases, and the overall weight of the floating pin 20 increases. On the other hand, the windage contact area S also increases, and the lifting force of the floating pin 20 also increases. Therefore, the sizes of the pin head 22 and the pin body 21 in the floating pin 20 need to be selected according to practical working conditions.

Figure 5:
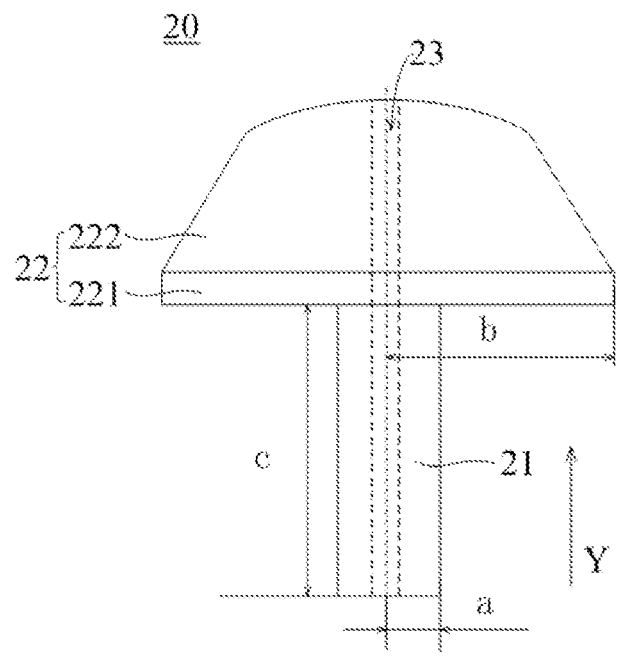
FIG. 5 is a dimensional schematic diagram of a floating pin according to an embodiment of the present application.

In a possible example, the pin body 21 is a cylinder, the fixed cross-section portion 221 is a cylinder, and the variable cross-section portion 222 is a truncated cone, and the taper of the truncated cone is less than or equal to 25 degrees. Referring to FIG. 5, the radius a of the pin body 21, the radius b of the fixed cross-section portion 221 and the height c of the pin body 21 satisfy the following formula:

$$c>2a>b.$$

In order to further reduce the lifting force on the floating pin 20, the floating pin 20 can be further provided with a pressure relief hole 23 which runs through the pin head 22 and the pin body 21. An example, the pressure relief hole 23 may run through the bottom surface of the pin body 21 and the top surface of the pin head 22, or alternatively, the pressure relief hole 23 runs through the bottom surface of the pin body 21 and the side surface of the pin head 22. The pressure relief hole 23 is communicated with the outside, so that the lift coefficient $C_y$ can be reduced, thereby reducing the lifting force, and the displacement of the floating pin 20 in relation to the mounting hole 12 due to pressure change can be decreased.

Figure 6:
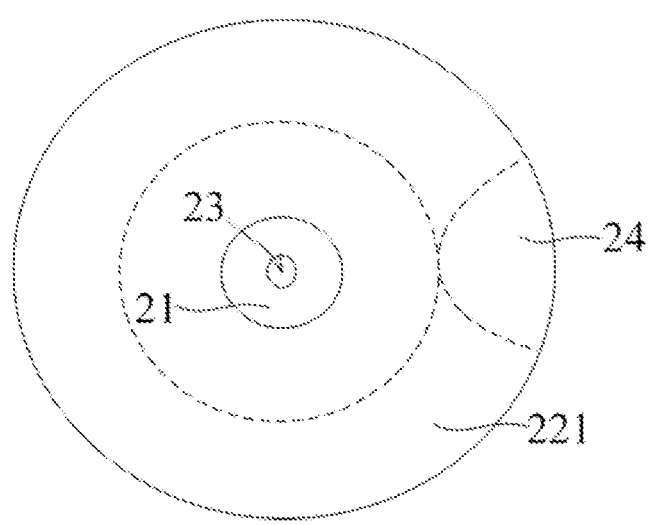
FIG. 6 is a view in Y-direction shown in FIG. 5.

The pressure relief hole 23 of the floating pin 20 can extend axially along the pin body 21 and run through the pin head 22. An example, the pressure relief hole 23 is a through hole which runs through the pin body 21 and the pin head 22. As shown in FIGS. 5 and 6, the through hole runs through the central areas of the pin body 21 and the pin head 22. The axis of the pressure relief hole 23 may coincide with the center line of the floating pin 20.

It should be noted that the axis of the pressure relief hole 23 as described above is a straight line, although the axis of the pressure relief hole 23 may also be a curved line. The pressure relief hole 23 may be a round hole or a square hole, and the shape of the pressure relief hole 23 is not specifically limited in the present embodiment. A plurality of pressure relief holes 23 may be provided, one ends of which are provided on the bottom surface of the pin body 21 and the other ends of which are provided on the pin head 22, so as to communicate the mounting hole 12 with the reaction chamber to reduce the pressure inside the mounting hole 12.

Figure 7:
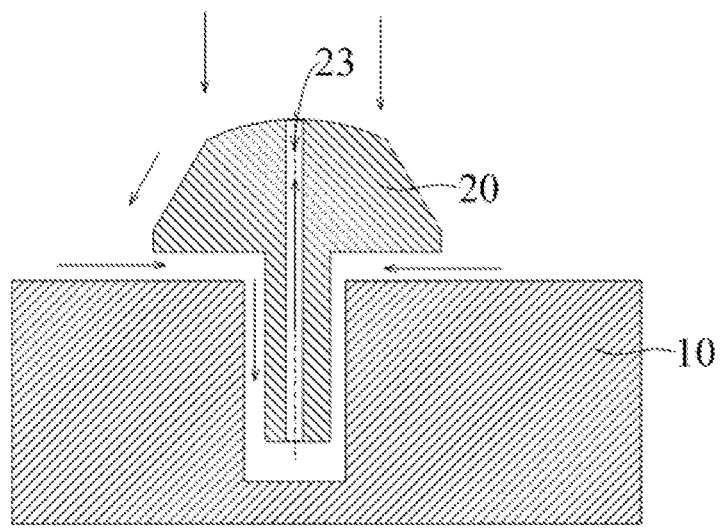
FIG. 7 is a working principle diagram of a pressure relief hole according to an embodiment of the present application.

Referring to FIG. 7, when the floating pin 20 has a pressure relief hole 23, the pressure relief hole 23 can equalize the pressure difference between the bottom surface of the pin body 21 and the top surface of the pin head 22. When there is an abrupt change in the pressure in the manufacturing process of the wafer 30, the air flow can flow from the bottom surface of the pin body 21 to the top surface of the pin head 22 through the pressure relief hole 23, thereby reducing the displacement of the floating pin 20 in relation to the mounting hole 12.

Figure 8:
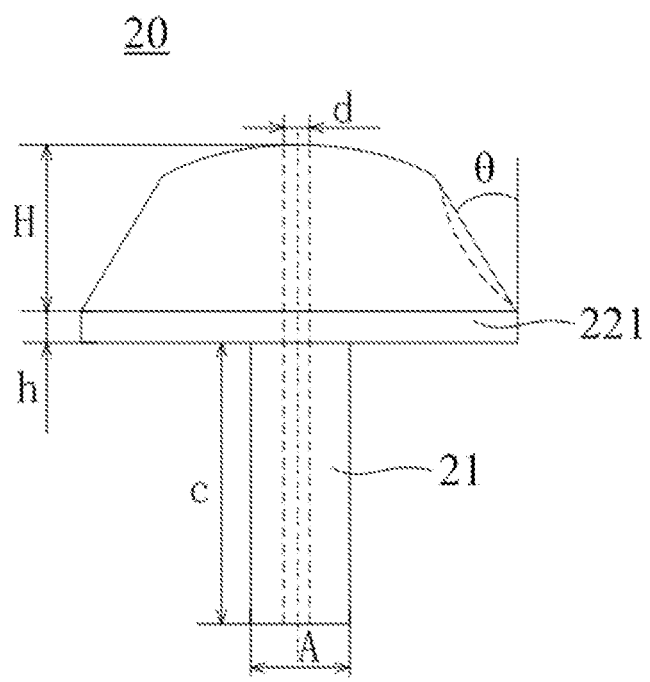
FIG. 8 is a dimensional schematic diagram of a floating pin according to an embodiment of the present application.
Figure 9:
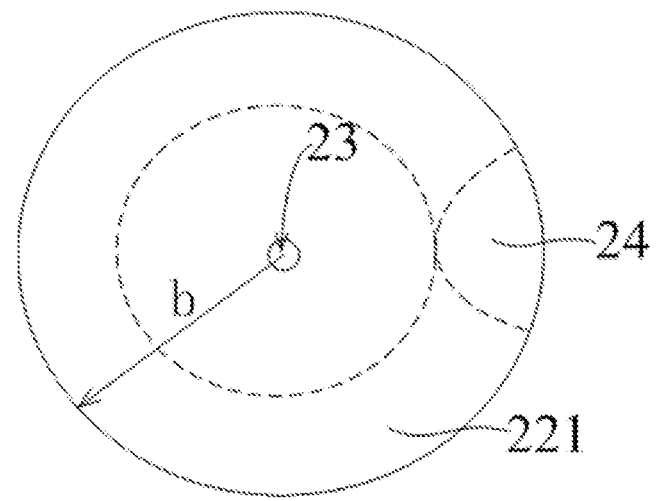
FIG. 9 is a top view of a floating pin according to an embodiment of the present application.

In a possible example, referring to FIGS. 8 and 9, the diameter A of the pin body 21 may be 6 mm±0.02 mm, the height c of the pin body 21 may be 12 mm±0.02 mm, the radius b of the fixed cross-section portion 221 may be 4 mm±0.05 mm, the height h of the fixed cross-section portion 221 may be 1 mm±0.02 mm, the height H of the variable cross-section portion 222 may be 3 mm±0.02 mm, the taper θ of the variable cross-section portion 222 may be 25 degrees, and the diameter d of the pressure relief hole 23 may be 0.2 mm±0.05 mm.

The floating pin 20 provided by the present embodiment may include a pin head 22 and a pin body 21, one end of the pin body 21 is connected to the pin head 22, and the pin head 22 protrudes in relation to a side surface of the pin body 21. By reducing the distance between the pin head 22 and a workpiece to be processed, the impact force on the workpiece to be processed when the pin head 22 collides with the workpiece to be processed can be reduced, damages to the workpiece to be processed can be reduced, and the yield of the workpiece to be processed can be improved. In addition, the side surface of the protruding part of the pin head 22 is a curved surface, which can reduce or avoid scratching the workpiece to be processed by the pin head 22, reduce damages to the workpiece to be processed, and further improve the yield of the workpiece to be processed.

Figure 10:
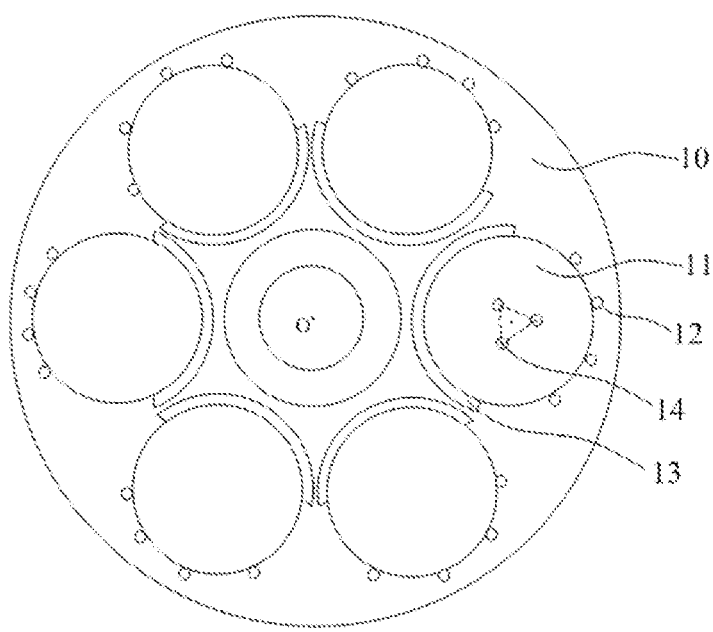
FIG. 10 is a schematic structural diagram of a machine table according to an embodiment of the present application.

Referring to FIG. 10, an embodiment of the present application also provides a wafer carrying device, which includes a machine table 10 and a floating pin 20.

The machine table 10 has a revolving center, as shown at 0 in FIG. 10, the machine table 10 can rotate around the revolving center. The machine table 10 can be a disk, and the revolving center of the machine table 10 is its circle center. As an example, the machine table 10 has a radius of 550 mm.

The machine table 10 may include a carrying area 11 for placing wafers, which may be a circular area with size consistent with the wafers. The carrying area 11 may be provided around the revolving center, so that the carrying area 11 can rotate around the revolving center.

A plurality of carrying areas 11 may be provided. As an example, a plurality of carrying areas 11 may be distributed at equal intervals around the revolving center. With this arrangement, the machine table 10 can carry a plurality of wafers at the same time, and deposit thin films on the plurality of wafers at the same time, thereby improving the wafer preparation efficiency.

With continued reference to FIG. 10, the carrying area 11 may be provided with a suck port 14, through which the wafer is sucked to the machine table 10, so that the wafer can rotate synchronously with the machine table 10. The suck port 14 can be communicated with a vacuum pumping device, for example, the suck port 14 is communicated with a vacuum pump. When the vacuum pump is vacuumized, the wafer is sucked to the suck port 14, thus being fixed in the carrying area 11.

The carrying area 11 can be provided with a plurality of suck ports 14, which can improve the effect of sucking the wafers. In addition, sucking wafers with a plurality of suck ports 14 can reduce or prevent damage to wafers caused by each suck port 14 due to excessive sucking force. A plurality of suck ports 14 may be provided around the center of the carrying area 11. As an example, three suck ports 14 are provided. The three suck ports 14 enclose a virtual regular triangle, as shown by the dotted line in FIG. 10, and the center of the carrying area 11 is located at the center of the virtual regular triangle.

With continued reference to FIG. 10, mounting holes 12 can be provided at the edge of the carrying area 11 away from the revolving center. As shown in FIG. 10, the mounting holes 12 are provided outside the carrying area 11 for placing the floating pins 20, so as to prevent the wafer from detaching from the carrying area 11 when the machine table 10 rotates at a high speed, which would otherwise lead to an interruption of the manufacturing process of the wafer, or even cause the wafer to be scrapped due to dicing.

The carrying area 11 may be provided with a plurality of mounting holes 12, which are equally distributed, that is, the distance between two adjacent mounting holes 12 is fixed. With this arrangement, when each mounting hole 12 is provided with the floating pin 20, the floating pin 20 can block the wafer 30 at multiple positions, and the blocking effect is better.

With continued reference to FIG. 10, a baffle 13 can be provided at the edge of the carrying area 11 close to the revolving center, as shown in FIG. 10, and the baffle 13 is provided inside the carrying area 11. The baffle 13 is provided opposite to the mounting holes 12. As an example, when a plurality of mounting holes 12 are provided at the edge of the carrying area 11, the virtual arc enclosed by the plurality of mounting holes 12 is opposite to the baffle 13.

It should be noted that the carrying area 11 can be a boss formed on the machine table 10 to facilitate picking and placing the wafer 30. The baffle 13 as described above is provided on the edge of the boss close to the revolving center of the machine table 10, and the mounting hole 12 as described above is provided on the edge of the boss away from the revolving center of the machine table 10.

The mounting hole 12 is provided with the floating pin of the above embodiment, which includes a pin head and a pin body. The pin body is inserted into the mounting hole 12, and the pin head is connected to one end of the pin body. The pin head protrudes in relation to the side surface of the pin body, so that the pin head can extend to the carrying area 11, thus making the pin head close to the wafer, reducing the distance between the pin head and the wafer, thereby reducing the impact on the wafer when the wafer collides with the pin head.

The side surface of the pin head protruding in relation to the pin body can be a curved surface, so as to avoid sharp edges from forming on the side surface of the pin head close to the wafer, thereby reducing or avoiding scratching the wafer by the pin head. The curved surface is formed with a recess facing the wafer, which can accommodate the edge of the wafer. As an example, the surface of the recess is matched with the side surface of the wafer. When the wafer collides with the pin head, part of the surface of the pin head is engaged with the side surface of the wafer, so that the wafer is in surface contact with the pin head, and the contact area is increased, thereby reducing the local stress on the wafer and alleviating the problem of stress concentration.

As an example, the pin head may include a fixed cross-section portion and a variable cross-section portion. One end of the fixed cross-section portion is connected to the pin body and the other end is connected to the variable cross-section portion. A fillet transition is made between the side surface of the fixed cross-section portion and the side surface of the variable cross-section portion to reduce or avoid scratching the wafer by the pin head. The recess as described above is provided in the side surface of the variable cross-section portion.

In still some other possible examples, the pin head and the pin body of the floating pin may be an integrated structure. The floating pin may be mushroom-shaped as a whole, and the material of the floating pin may be ceramic.

In order to prevent the floating pin from being rushed out of the mounting hole 12 as the pressure changes, the floating pin in the embodiment of the present application is also provided with a pressure relief hole which runs through the pin head and the pin body and is communicated with the outside. When the pressure changes, the air flow can be discharged from the mounting hole 12 through the pressure relief hole, thereby reducing the displacement of the floating pin in relation to the mounting hole 12 and preventing the floating pin from being rushed out of the mounting hole 12. The pressure relief hole runs through the bottom surface of the pin body and the top surface of the pin head, or alternatively, the pressure relief hole runs through the bottom surface of the pin body and the side surface of the pin head.

As an example, the pressure relief hole of the floating pin can extend axially along the pin body and run through the pin head. The pressure relief hole may be a through hole which runs through the pin body and the pin head. For example, the through hole runs through the central areas of the pin body and the pin head. The axis of the pressure relief hole may coincide with the center line of the floating pin.

The wafer carrying device provided by the present embodiment may include a machine table 10 and floating pins. The machine table 10 has a revolving center, that is, the machine table 10 can rotate around the revolving center, and the machine table 10 may include a carrying area 11 provided around the revolving center for placing wafers. Mounting holes 12 are provided at the edge of the carrying area 11 away from the revolving center, and a floating pin is provided in the mounting hole 12, so as to limit and block the wafer and prevent the wafer from being thrown out of the carrying area 11 when the machine table 10 rotates. The floating pin includes a pin head and a pin body, the pin body is inserted into the mounting hole 12, and the pin head protrudes in relation to the side surface of the pin body, so that at least part of the pin head extends to the carrying area, thereby shortening the distance between the pin head and the wafer. When the wafer collides with the pin head, the impulse between the wafer and the pin head is reduced, and the impact on a given wafer is reduced, thereby reducing damages to the wafer and improving the yield of the wafer. In addition, the side surface of the pin head protruding in relation to the pin body is a curved surface, which reduces or avoids scratching the wafer by the pin head, thereby reducing damages to the wafer and further improving the yield of the wafer.

An embodiment of the present application provides a depositing apparatus for depositing a thin film onto the surface of a wafer, for example, forming a thin film on the surface of a wafer by chemical vapor deposition. Generally, the depositing apparatus includes a reaction chamber. The pressure in the reaction chamber can vary from Storrs to 760 torrs to satisfy the requirements for different pressures in wafer manufacturing process.

A nozzle can be provided in the reaction chamber for inputting gas required for deposition into the reaction chamber. A plurality of nozzles can be provided to improve the deposition efficiency. As an example, a plurality of nozzles can be uniformly distributed in the upper region of the reaction chamber.

A wafer carrying device is also provided inside the reaction chamber for placing wafers. The wafer carrying device can be provided opposite to the nozzle. As an example, the wafer carrying device can be provided directly under the nozzle to facilitate depositing thin films on the wafer surface. The wafer carrying device can rotate, so that in the process of depositing a thin film on the surface of a wafer placed on the wafer carrying device, the formed film has good uniformity, that is, the film thickness is relatively consistent.

The machine table has a revolving center, so that it can rotate around the revolving center. The machine table includes a carrying area for placing wafers which is consistent to the wafers. The carrying area can be provided around the revolving center, so that the carrying area can rotate around the revolving center.

Mounting holes can be provided at the edge of the carrying area away from the revolving center. As an example, the mounting holes are provided outside the carrying area for placing the floating pins, so as to prevent the wafer from detaching from the carrying area when the machine table rotates at a high speed.

The floating pin may include a pin head and a pin body. The pin body is inserted into the mounting hole, and the pin head is connected to one end of the pin body. The pin head protrudes in relation to the side surface of the pin body, so that the pin head can extend to the carrying area, thus making the pin head close to the wafer, reducing the distance between the pin head and the wafer, and thereby reducing the impact on the wafer when the wafer collides with the pin head.

The side surface of the pin head protruding in relation to the pin body can be a curved surface, so as to avoid sharp edges from forming on the side surface of the pin head close to the wafer, thereby reducing or avoiding scratching the wafer by the pin head. The curved surface is formed with a recess facing the wafer, which can accommodate the edge of the wafer. As an example, the surface of the recess is matched with the side surface of the wafer. When the wafer collides with the pin head, part of the surface of the pin head is engaged with the side surface of the wafer, so that the wafer is in surface contact with the pin head and the contact area is increased, thereby reducing the local stress on the wafer and alleviating the problem of stress concentration.

In order to prevent the floating pin from being rushed out of the mounting hole when the pressure changes, the floating pin in the present embodiment is further provided with a pressure relief hole which runs through the pin head and the pin body and is communicated with the outside. When the pressure changes, the air flow can be discharged from the mounting hole through the pressure relief hole, thereby reducing the displacement of the floating pin in relation to the mounting hole and preventing the floating pin from being rushed out of the mounting hole. The pressure relief hole runs through the bottom surface of the pin body and the top surface of the pin head, or alternatively, the pressure relief hole runs through the bottom surface of the pin body and the side surface of the pin head.

As an example, the pressure relief hole of the floating pin can extend axially along the pin body and run through the pin head. The pressure relief hole may be a through hole which runs through the pin body and the pin head. For example, the through hole runs through the central areas of the pin body and the pin head.

The depositing apparatus in the present embodiment includes a reaction chamber in which a wafer carrying device is provided. The wafer carrying device includes a machine table and floating pins, in which the machine table has a revolving center and includes a carrying area provided around the revolving center for placing wafers. Mounting holes are provided at the edge of the carrying area away from the revolving center, and a floating pin is provided in the mounting hole, so as to limit and block the wafer and prevent the wafer from being thrown out of the carrying area as the machine table rotates. The floating pin includes a pin head and a pin body. The pin body is inserted into the mounting hole, and the pin head protrudes in relation to the side surface of the pin body, so that at least part of the pin head extends to the carrying area, thereby shortening the distance between the pin head and the wafer. When the wafer collides with the pin head, the impulse between the wafer and the pin head is reduced, and the impact on a given wafer is reduced, thereby reducing damages to the wafer and improving the yield of the wafer. In addition, the side surface of the pin head protruding in relation to the pin body is a curved surface, which reduces or avoids scratching the wafer by the pin head, thereby reducing damages to the wafer and further improving the yield of the wafer.

In the description, each embodiment or implementation is described in a progressive manner, and each embodiment focuses on the differences from other embodiments, so it is sufficient to refer to each other for the same and similar parts between various embodiments.

It should be understood by those skilled in the art that in the disclosure of the present application, the orientation or positional relationship indicated by the terms "longitudinal", "transverse", "upper", "lower", "front", "rear", "left", "right", "vertical", "horizontal", "top", "bottom", "inner", "out" and the like is based on the orientation or positional relationship shown in the accompanying drawings and is only for the convenience of describing the present application and simplifying the description, and does not indicate or imply that the referred system or element must have a specific orientation, be constructed and operated in a specific orientation, so the above terms shall not be understood as limiting the present application.

In the description of this specification, the description with reference to "one embodiment", "some embodiments", "illustrative embodiments", "examples", "specific examples" or "some examples" and the like means that the specific features, structures, materials or characteristics described in connection with the embodiments or examples are included in at least one embodiment or example of the present application. In this specification, illustrative expressions of the above terms do not necessarily refer to the same embodiments or examples. Furthermore, the specific features, structures, materials or characteristics described may be combined in a suitable manner in any one or more embodiments or examples.

In conclusion, it should be noted that the above embodiments are only used to illustrate, but not to limit, the technical solutions of the present application. Although the present application has been described in detail with reference to the foregoing embodiments, those of ordinary skills in the art should understand that the technical solutions set forth in the foregoing embodiments can still be modified, or some or all of the technical features can be equivalently replaced. However, these modifications or replacements do not make the essence of the corresponding technical solutions depart from the scope of the technical solutions of each embodiment of the present application.

What is claimed is:

1. A floating pin, comprising a pin body and a pin head connected to one end of the pin body, wherein the pin head protrudes in relation to a side surface of the pin body, and a side surface of a protruding part of the pin head is a curved surface;
    wherein the floating pin is further provided with a pressure relief hole running through the pin body and the pin head;
    wherein the floating pin is further provided with a pressure relief hole running through a bottom surface of the pin body and a top surface of the pin head, or alternatively, the floating pin is further provided with a pressure relief hole running through the bottom surface of the pin body and the side surface of the pin head.

2. The floating pin according to claim 1, wherein the curved surface of the pin head forms a recess for accommodating an edge of a workpiece to be processed, and a surface of the recess is matched with a surface of the workpiece to be processed.

3. The floating pin according to claim 2, wherein the floating pin is mushroom-shaped.

4. The floating pin according to claim 2, wherein the pin head comprises a fixed cross-section portion connected to the pin body and a variable cross-section portion connected to the fixed cross-section portion, and a fillet transition is made between a side surface of the fixed cross-section portion and a side surface of the variable cross-section portion.

5. The floating pin according to claim 4, wherein the side surface of the variable cross-section portion is provided with the recess.

6. The floating pin according to claim 4, wherein surfaces where the fixed cross-section portion and the variable cross-section portion are connected to each other coincide.

7. The floating pin according to claim 4, wherein the fixed cross-section portion and the pin body are cylinders, and a radius of the fixed cross-section portion is greater than that of the pin body; and the variable cross-section portion is a truncated cone.

8. The floating pin according to claim 7, wherein the radius of the pin body, a height of the pin body and the radius of the fixed cross-section portion satisfy the following formula:

$$c>2a>b;$$

where a is the radius of the pin body, b is the radius of the fixed cross-section portion, and c is the height of the pin body.

9. The floating pin according to claim 7, wherein a taper of the truncated cone is less than or equal to 25 degrees.

10. The floating pin according to claim 7, wherein the pin body has a diameter of 6 mm±0.02 mm, the pin body has a height of 12 mm±0.02 mm, the fixed cross-section portion has the radius of 4 mm±0.05 mm, the fixed cross-section portion has a height of 1 mm±0.02 mm, and the variable cross-section portion has a height of 3 mm±0.02 mm.

11. The floating pin according to claim 1, wherein the floating pin is mushroom-shaped.

12. A wafer carrying device, comprising:
    a machine table with a revolving center, wherein the machine table comprises a carrying area provided around the revolving center and used for placing wafers, and an edge of the carrying area away from the revolving center is provided with mounting holes; and
    the floating pin according to claim 1 installed in the mounting hole, the pin body is inserted into the mounting hole, and at least part of the pin head extends to the carrying area.

13. A depositing apparatus, comprising a reaction chamber, within which the wafer carrying device according to claim 12 is provided.

14. A floating pin, comprising a pin body and a pin head connected to one end of the pin body, wherein the pin head protrudes in relation to a side surface of the pin body, and a side surface of a protruding part of the pin head is a curved surface;
    wherein the floating pin is further provided with a pressure relief hole running through the pin body and the pin head;
    wherein the pressure relief hole is a through hole, which runs through central areas of the pin body and the pin head.

15. The floating pin according to claim 14, wherein the curved surface of the pin head forms a recess for accommodating an edge of a workpiece to be processed, and a surface of the recess is matched with a surface of the workpiece to be processed.

16. The floating pin according to claim 15, wherein the floating pin is mushroom-shaped.

17. The floating pin according to claim 15, wherein the pin head comprises a fixed cross-section portion connected to the pin body and a variable cross-section portion connected to the fixed cross-section portion, and a fillet transition is made between a side surface of the fixed cross-section portion and a side surface of the variable cross-section portion.

18. The floating pin according to claim 17, wherein the side surface of the variable cross-section portion is provided with the recess.

19. The floating pin according to claim 17, wherein surfaces where the fixed cross-section portion and the variable cross-section portion are connected to each other coincide.

20. A floating pin, comprising a pin body and a pin head connected to one end of the pin body, wherein the pin head protrudes in relation to a side surface of the pin body, and a side surface of a protruding part of the pin head is a curved surface;
    wherein the curved surface of the pin head forms a recess for accommodating an edge of a workpiece to be processed, and a surface of the recess is matched with a surface of the workpiece to be processed;
    wherein the pin head comprises a fixed cross-section portion connected to the pin body and a variable cross-section portion connected to the fixed cross-section portion, and a fillet transition is made between a side surface of the fixed cross-section portion and a side surface of the variable cross-section portion;
    wherein the fixed cross-section portion and the pin body are cylinders, and a radius of the fixed cross-section portion is greater than that of the pin body; and the variable cross-section portion is a truncated cone;
    wherein the pin body has a diameter of 6 mm±0.02 mm, the pin body has a height of 12 mm±0.02 mm, the fixed cross-section portion has the radius of 4 mm±0.05 mm, the fixed cross-section portion has a height of 1 mm±0.02 mm, and the variable cross-section portion has a height of 3 mm±0.02 mm.

\* \* \* \* \*